United States Patent [19]

Collumeau

[11] 4,007,475
[45] Feb. 8, 1977

[54] SEMICONDUCTOR SWITCHING DEVICE

[75] Inventor: Yoland Collumeau, Paris, France

[73] Assignee: Thomson-CSF, Paris, France

[22] Filed: Feb. 21, 1975

[21] Appl. No.: 551,856

[30] Foreign Application Priority Data

Feb. 22, 1974 France .............................. 74.06205

[52] U.S. Cl. .................................. 357/39; 357/64
[51] Int. Cl.² ...................................... H01L 29/747
[58] Field of Search .......................... 357/38, 39, 64

[56] References Cited

UNITED STATES PATENTS

| 3,123,750 | 3/1964 | Hutson et al. | 357/39 |
| 3,590,346 | 6/1971 | Bilo et al. | 357/38 |
| 3,727,116 | 4/1973 | Thomas et al. | 357/64 |

Primary Examiner—Michael J. Lynch
Assistant Examiner—Joseph E. Clawson, Jr.
Attorney, Agent, or Firm—Cushman, Darby & Cushman

[57] ABSTRACT

The present invention relates to switching devices integrated into a single semi-conductor block and constituted by a thyristor and a diode, their cathodes and anodes being connected head-to-tail in parallel.

In accordance with the invention, unwanted diffusion into the thyristor section (16) (17), of minority charge carriers coming from the diode section (7)(11), is prevented by the interposition of an insulating layer (31) beneath the connection M linking the anode of the diode with the cathode of the thyristor, this having the effect of limiting the lines of current flow through the diode, to the contour (10).

The applications are to be found in particular in the field of scanning devices for cathode-ray tubes.

5 Claims, 4 Drawing Figures

SEMICONDUCTOR SWITCHING DEVICE

The present invention relates to the field of semi-conductor devices, and is concerned with known kinds of switching circuits comprising a thyristor and a diode, connected in parallel, the anode of the diode being connected to the cathode of the thyristor, and the cathode of the diode to the anode of the thyristor. This combination is encountered very frequently in applications, for example in inverters, switching circuits and pulse generators and, in practice, it has been found useful to combine the two components, diode and thyristors, plus their connections, in one and the same casing. It is particularly advantageous to perform this combination by using techniques of monolithic integration, in a single semi-conductor block or wafer, using a structure of the kind known as an integrated circuit, connections between the two components being formed by deposits of metal layers.

However, combinations of this kind have several drawbacks, associated with the risk of insufficient separation between the two adjacent parts of the block, corresponding respectively to the thyristor and diode functions. One of these drawbacks, a structural consideraton, is the difficulty, due to the geometric proximity of the two integrated components, which arises in ensuring adequate breakdown resistance; another of these drawbacks, associated with the composition, is the difficulty which arises in differentiating precisely between the physical chemical characteristics of the two parts, independently of one another, in order to confer upon them the desired characteristics as far as the nature, number and mobility of the electrical charges involved, are concerned.

Finally, another drawback, this time of a functional nature, arises from the contradictory nature of the conditions of operation of the two integrated components, in accordance with which, due to their relative mode of connection, the diode is conductive whilst the thyristor is blocked, and vice versa. Now, the combination of the two circuits, diode and thyristor, in a single semi-conductor block, gives rise to the danger that migration of electrical charge carriers will take place from one towards the other, by diffusion through the body of the block, and this could compromise the proper operation of the thyristor. This risk leads, on the one hand, to the need to create large intervals between the two components, and these are undesirable on many counts, and, on the other hand, to the need to delimit the lines of current flow of the charge carriers by the formation, in the semi-conductor block, of supplementary regions or electrodes which increase the number of manufacturing operations and consequently the cost price.

The integrated thyristor and diode circuit which forms the object of the present invention, does not suffer from these drawbacks.

In its principle, it has recourse, in order to delimit the lines of current flow of the charge carriers, not to regions or electrodes created within the semi-conductor block, but, instead, to electrically insulating layers deposited upon certain parts of the external faces of said block, layers whose interposition between the semi-conductor body and the metal layers, playing the part of connections, defines, by a special limitation of their zones of contact with the appropriate regions of the two integrated components, a high degree of electrical isolation between the two parts of the block which they occupy.

The interval values of these two parts can thus be decreased, if necessary, to the diffusion length of the electrical charge carriers between the two respective parts occupied by the two components, diffusion being one of the limitation factors which has been indicated earlier as having an undesirable influence.

Thus, the present invention is concerned with a solid-state switching device, constituted by a thyristor and a diode integrated into two parts of one and the same monocrystalline semi-conductor block, which has two opposite principal faces, the anode of the thyristor and the cathode of the diode extending up to one of said faces where they are electrically connected, the gate of the thyristor extending up to the other of said faces as also do the anode of the diode and the cathode of the thyristor, whose two respective surfaces are electrically linked by a conductive connecting layer carried by said other face, device wherein said conductive connecting layer is separated from the face which carries it, at least over the portion comprised between said surfaces, by a layer of an electrically insulating material.

The invention will be better understood from a consideration of the ensuing description, and with reference to the attached figures where:

FIG. 1 (a) and (b) illustrates, in section, a thyristor-diode device in accordance with the prior art;

Figure 1:
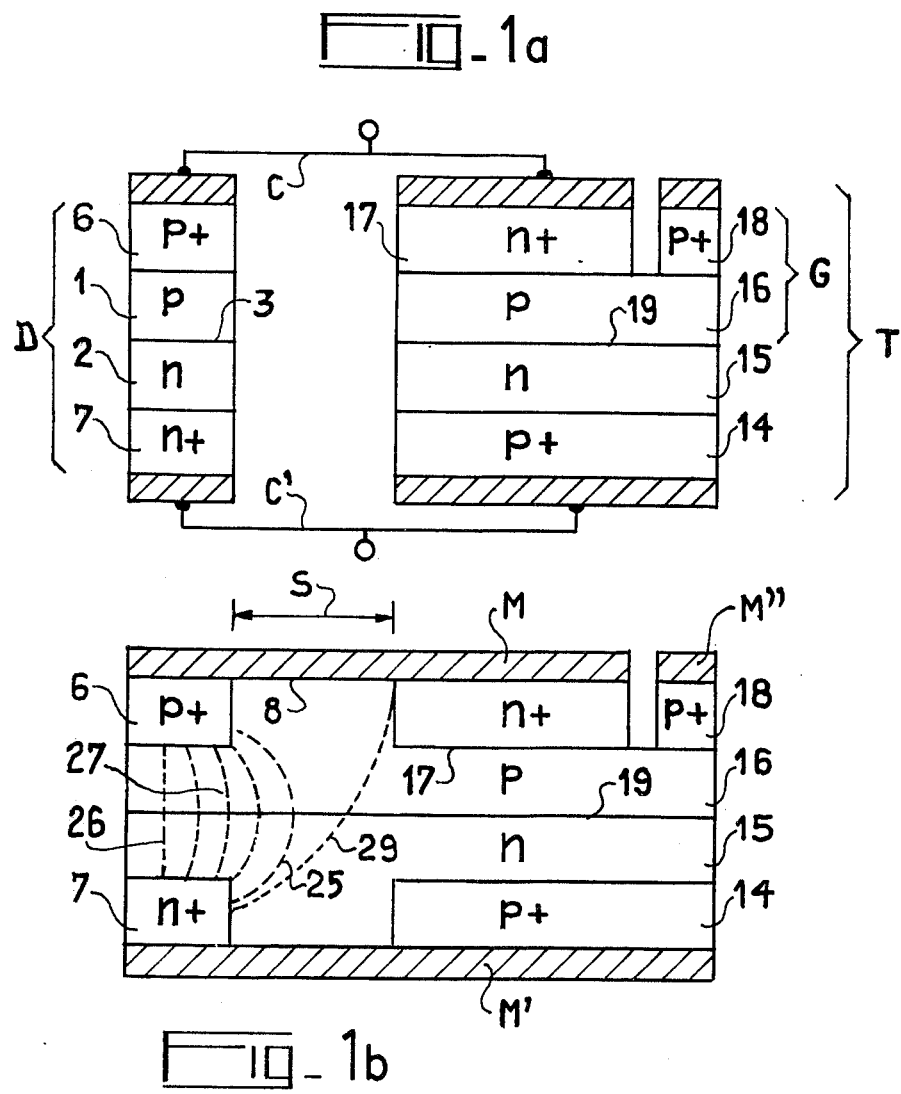
FIG. 1 (a) illustrates a circuit of prior art kind, constituted by two parallel-connected semi-conductor devices, on the one hand a thyristor T with a triggering electrode G, or gate, which first device, throughout the following, and by way of simplification, will be designated by the term thyristor, and on the other hand a diode D.

The diode D is constituted by an anode zone 1 and a cathode zone 2, with a common surface 3 constituting the rectifying $pn$ junction; the regions 6 and 7 of the diode respectively marked $p+$ and $n+$ and given a high conductivity by high impurities doping levels, constitute the non-rectifying contacts or ohmic contacts, required for the connection of the diode.

The thyristor T is consituted by an anode zone 14 of $p+$conductivity type, a base 15 of $n$ conductivity type and a cathode zone 17 of $n+$ conductivity type; the gate zone is constituted by the $p$ type layer 16; the region 18 marked $p+$, which has been given a high conductivity by the use of high impurities doping levels, constitutes the ohmic contact required for the connection of the gate layer 16 to an external control circuit which has not been shown.

The surface 19, common to the base 15 and the gate zone 16, constitutes a $pn$ junction.

Finally, as indicated, connections C and C' are established so that when the diode is biased in the forward direction, the thyristor is in the non-conducting or blocked state, and vice-versa.

In order to reduce the bulk and manufacturing cost of this kind of circuit, already an embodiment has been described which employs the principle of microminiaturization, known by the name of monolithic integration, where, in a single semi-conductor block or wafer, there are created, by a localized physico-chemical process, the requisite characteristic geometric and electrical zones.

FIG. 1 (b) schematically illustrates a monolithic integrated circuit of this kind, with on the one hand the thyristor T and its gate G, and on the other hand the diode D.

The connections corresponding to those of FIG. 1 (a) are formed by metal layers such as those M and M'.

However, the combination within a single semi-conductor block of the two devices D and T which are conventionally separated by a geometric insulating space, leads to the need to maintain the requisite separation in the form of an electrically insulating space such as that S, constituted here by a section of semi-conductor of sufficient resistivity and size to prevent the diffusion of electrical charge carriers from the diode, from penetrating, in operation of the system, into the zone occupied by the thyristor.

In other words, a fundamental operating parameter in thyristors is the speed at which it is possible to establish the blocking condition there, this being determined by the speed with which the voltage rises to the blocking level without bringing about a change to the conductive state. The integration into a single semi-conductor block of a thyristor and diode, gives rise to the risk of the unwanted occurrence, in the part occupied by the thyristor, of minority charge carriers created during the conduction phase of the adjacent diode, which charge carriers lower the maximum speed at which the thyristor blocking condition can establish.

This is why, in the known embodiment shown in FIG. 1 (b), the diode section is moreover delimited by regions of reduced size, rendered highly conductive by giving them high impurities doping levels, regions such as those 6 and 7, which define the lines of current flow to the diode, as for example 25, 26 and 27.

It is useful, furthermore, in the case where certain minority charge carriers may pass beyond the contour 25 of the lines of current flow, and diffuse, in an unwanted fashion, into the insulating space, reaching the neighbourhood of the thyristor section, to reduce their life time by diffusing suitable impurities into this space, as for example gold atoms.

However, the structure of FIG. 1 (b) has a major drawback associated with the presence of the electrically conductive layer M which is located in contact with the top face of the semi-conductor block, in the section 8.

In other words, because of the practical need, dictated by economic considerations, to give the layer P a relatively high conduction level, the zone 8, in association with the conductive layer, behaves in a similar fashion to the highly conductive region 6 delimiting the lines of current flow in the diode zone; and in practice, the two lines of current flow in this section have an external contour such as that 29, this penetrating considerably into the insulating space S and running the risk of creating there the unwanted phenomena referred to.

Figure 2:
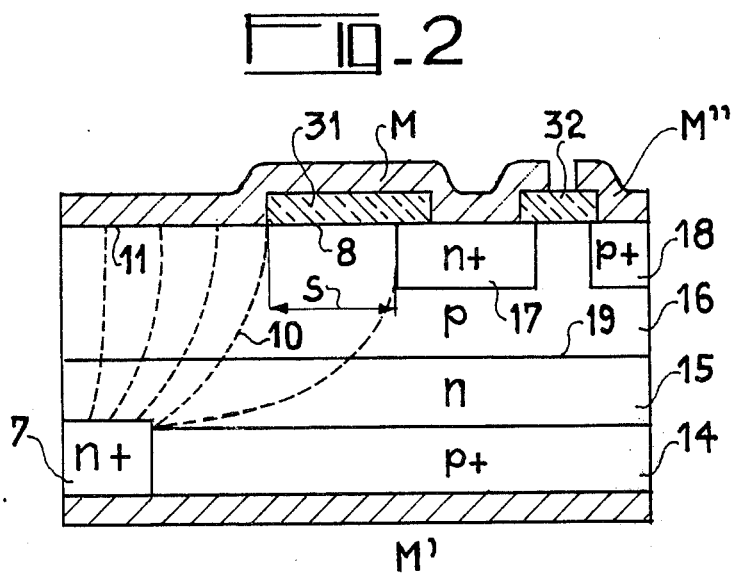
FIG. 2 illustrates, in section, a first embodiment of a thyristor-diode device in accordance with the invention.

FIG. 2 illustrates an integrated structure in accordance with the invention, which does not suffer this drawback.

In the principle, recourse has been had there to a moving apart of the conductive layer M, which connects the respective parts of thyristor and diode, from the zone 8 at the top face of the semi-conductor block, over the whole of that portion of the conductive layer which does not play the part of a connection. In a preferred embodiment, this moving apart, or spacing, is achieved by a section of insulating layer 31, on which the conductive layer has been deposited. A material particularly suitable for this insulating function, in particular in the case where the semi-conductor block is made of silicon, is silicon dioxide or silica, said oxide being easily created by local oxidation of the silicon block.

The lines of current flow 10 in the diode section are thus easily and simply delimited by the choice of the extent of the area of contact 11 between the conductive layer and the semi-conductor block.

On the other hand, another advantage of the invention which comprises the deposition of an insulating layer, resides in the facility which it offers of protecting the junctions by the use of layers 31 and 32 of insulating oxide associated with a planar type of structure, as for example in the case of the zones 17 and 18.

Figure 3:
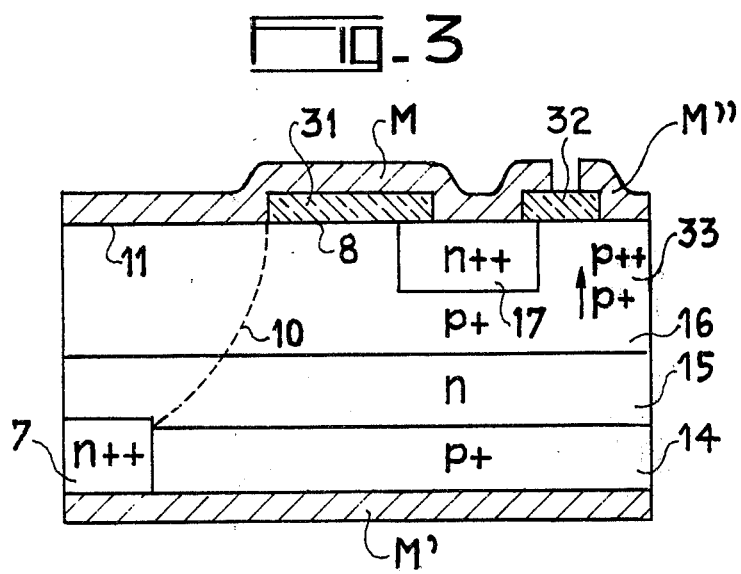
FIG. 3 illustrates, in section, a second embodiment of this device.

FIG. 3 illustrates another particularly advantageous embodiment of the integrated structure in accordance with the invention.

In this embodiment, the gate zone 16, of $p$ type conductivity, receives a doping impurity concentration in excess of that of the gate zone shown in FIG. 2, and this raises it to the same $p+$ concentration as the anode zone 14. On the other hand, in order to maintain the same concentration ratio, the two cathode zones 7 and 17 of $n$ type conductivity, belonging respectively to diode and thyristor, are given an $n++$ impurity doping concentration. The advantage of this resides in the fact that under these circumstances, the contact zone 18 of FIG. 2, having the high doping impurity concentration, is no longer necessary since the gate zone throughout has a high $p+$ concentration. In fact, it is at an even higher concentration, close to $p++$: in other words, the formation of the $p+$ zones in the structure in accordance with the invention, is carried out by the diffusion of $p$ type impurities into the main faces of an $n$-type semi-conductor block, and under these conditions a rising concentration gradient is formed inside the $p+$ zones as the principal faces are approached, this being in particular the case in the part 33 of the zone located in the immediate neighbourhood of the gate contact M'''', which is then substantially at the $p++$ concentration level.

The invention therefore, in contrast to the known structures, makes it unnecessary to form certain regions which have been given higher conductivity by receiving a higher doping level, such as the regions 6 and 18 of FIG. 1 (b), and this reduces the number of operations required at the time of manufacture, and consequently the corresponding cost price.

The structure in accordance with the invention furthermore has the advantage, due to the excellent delimitation of the lines of current flow in the diode section, of making it possible to reduce the insulating space S required between the diode and the thyristor, and this reduces the dimensions of the semi-conductor block used.

Finally, if, in the case of fast-switching devices, it should be considered necessary to introduce charge recombination centres, in the manner already indicated earlier, into the insulating space, in order to reduce the life time of the minority charge carriers, centres such as gold atoms for example, then the invention has the advantage that it makes it possible to choose the density of these centres within a wider range of values, since it no longer requires the introduction of such a high concentration into said insulating space.

Of course, the invention is not limited to the embodiment described and shown, which was given solely by way of example.

What is claimed is:

1. A solid-state switching, device, constituted by a thyristor and a diode integrated into two parts of one and the same monocrystalline semi-conductor block which has two opposite principal faces, the anode (14) of the thyristor and the cathode (7) of the diode extending up to one of said faces where they are electrically connected, the gate of the thyristor extending up to the other of said faces (16) (18) as also do the anode (11) of the diode and the cathode (17) of the thyristor whose two respective surfaces are unbroken and electrically linked by a conductive connecting layer (M) carried by said other face, device wherein said conductive connecting layer is separated from the face which carries it, at least over the portion (8) comprised between said surfaces, by a layer (31) of an electrically insulating material the extension of said layer on said other face, from the thyristor cathode surface region, being at least equal to the diffusion length of the electrical charge carriers between said thyristor and said diode regions, and the region between said thyristor and diode regions being without added recombination centers.

2. A device as claimed in claim 1, wherein the electrically insulating layer of material extends partly over that of said surfaces which belongs to the thyristor cathode.

3. A device as claimed in claim 2, wherein the layer of electrically insulating material extends partly also over that of said surfaces belonging to the thyristor gate zone.

4. A device as claimed in claim 1, wherein said electrically insulating material is silicon dioxyde.

5. A device as claimed in claim 4, wherein said monocrystalline semi-conductor block is silicon.

* * * * *